(12) United States Patent
Chiu

(10) Patent No.: US 9,099,463 B2
(45) Date of Patent: Aug. 4, 2015

(54) LAYOUT STRUCTURE AND VERSION CONTROL CIRCUIT FOR INTEGRATED CIRCUITS

(75) Inventor: Yang-Ming Chiu, Yonghe (TW)

(73) Assignee: Realtek Semiconductor Corp., Hsinchu (TW)

( * ) Notice: Subject to any disclaimer, the term of this patent is extended or adjusted under 35 U.S.C. 154(b) by 646 days.

(21) Appl. No.: 13/107,159

(22) Filed: May 13, 2011

(65) Prior Publication Data

US 2011/0278743 A1 Nov. 17, 2011

(30) Foreign Application Priority Data

May 14, 2010 (TW) .............................. 099115407 A

(51) Int. Cl.
| | |
|---|---|
| *H01L 23/48* | (2006.01) |
| *H01L 23/522* | (2006.01) |
| *H01L 23/544* | (2006.01) |
| *H01L 27/02* | (2006.01) |

(52) U.S. Cl.
CPC ............ *H01L 23/522* (2013.01); *H01L 23/544* (2013.01); *H01L 27/0207* (2013.01); *H01L 2223/5444* (2013.01); *H01L 2223/54413* (2013.01); *H01L 2924/0002* (2013.01)

(58) Field of Classification Search
CPC ................ H01L 23/522; H01L 23/544; H01L 2223/5444; H01L 2223/54413; H01L 27/0207
USPC ...................... 257/211; 327/365, 427; 326/38
See application file for complete search history.

(56) References Cited

U.S. PATENT DOCUMENTS

| | | | | |
|---|---|---|---|---|
| 5,831,280 | A  * | 11/1998 | Ray ................................. | 257/48 |
| 6,559,544 | B1 * | 5/2003 | Roth et al. .................... | 257/758 |
| 7,120,886 | B2 * | 10/2006 | Deleule .......................... | 716/50 |
| 7,196,363 | B2 * | 3/2007 | Montagnana ................. | 257/207 |
| 2004/0188720 | A1 * | 9/2004 | Chew ............................ | 257/211 |
| 2006/0220013 | A1 * | 10/2006 | Bachman et al. ............... | 257/48 |
| 2006/0278987 | A1 * | 12/2006 | Yu et al. ......................... | 257/758 |
| 2008/0054985 | A1 * | 3/2008 | Tsai et al. ..................... | 327/427 |

* cited by examiner

*Primary Examiner* — Mohammad Islam
*Assistant Examiner* — John P Dulka
(74) *Attorney, Agent, or Firm* — Rosenberg, Klein & Lee

(57) ABSTRACT

The present invention relates to a layout structure and a version control circuit for integrated circuits. The layout structure for integrated circuits according to the present invention comprises a signal-supplying unit and at least a transfer cell. The signal-supplying unit is used for supplying a first signal and a second signal. The transfer cell has a plurality of metal layers interconnected. One of metal layers receives and transfers the first signal or the second signal. When changing the transfer cell to transfer the second signal instead of the first signal, the metal layers interrupt transferring the first signal but receive and output the second signal. When the circuit is revised and multiple sub-circuits as well as the transferred signal are changed, the fewest metal layers commonly adopted are used. Accordingly, the present invention can reduce effectively the number of masks, and thus reducing costs.

8 Claims, 7 Drawing Sheets

US 9,099,463 B2

LAYOUT STRUCTURE AND VERSION CONTROL CIRCUIT FOR INTEGRATED CIRCUITS

FIELD OF THE INVENTION

The present invention relates generally to a layout structure and a version control circuit, and particularly to a layout structure and a version control circuit for integrated circuits.

BACKGROUND OF THE INVENTION

After an integrated circuit is developed and designed, the designed integrated circuit is fabricated on chips by foundries. Nonetheless, during the fabrication process of modern increasingly complex chips, few products are fabricated successfully at the first time and need no further modifications afterwards. Most circuits need repeated revisions. For saving development costs, revisions can be categorized as all layer change and metal change. The former changes all masks from the substrate to the topmost metal layer; the latter changes only the masks of metal layers. According to the number of changed metal layers, different costs occur. Thereby, for the purpose of cost control, how to change as few metal layers as possible during revisions is the main challenge. Besides, during revisions, in addition to correct errors in circuits, it is required to record the version number in the chip. However, changing the version number needs to modify the layout of the internal circuit of the chip. In digital circuits, routing usually follows rules. For example, wires in odd layers are usually routed vertically, while those in even layers are usually routed horizontally. Thereby, once the change of a wire happens at its own corner, three layers of masks have to be changed. It turns out that the number of masks needing to change for revision may possibly greater than that for correcting errors.

Accordingly, the present invention provides a layout structure and a version control circuit for integrated circuits, which can avoid increases in costs by not using excessive masks while changing the layout structure, and thus the problem described above can be solved.

SUMMARY

An objective of the present invention is to provide a layout structure and a version control circuit for integrated circuits, which change a transferred first signal in a plurality of metal layers of a transfer cell to a second signal or the transferred second signal in the metal layers of the transfer cell to the first signal. Thereby, the number of masks can be reduced, and thus reducing costs.

Another objective of the present invention is to provide a layout structure and a version control circuit for integrated circuits, which is applied to recording the version number of integrated circuits. Thereby, the number of masks used for changing the version number can be reduced, and thus reducing costs.

Still another objective of the present invention is to provide a layout structure and a version control circuit for integrated circuits, which is applied to debugging the layout structure of integrated circuits. Thereby, increases in the number of masks for substantial modifications can be avoided, and thus reducing costs.

The layout structure for integrated circuits according to the present invention comprises a signal-supplying unit and at least a transfer cell. The signal-supplying unit is used for supplying a first signal and a second signal. The transfer cell has a plurality of metal layers interconnected. One of metal layers receives and transfers the first signal or the second signal. When changing the transfer cell to transfer the second signal instead of the first signal, the metal layers interrupt transferring the first signal but receive and output the second signal. When the circuit is revised and multiple sub-circuits as well as the transferred signal are changed, the fewest metal layers commonly adopted are used. Accordingly, the present invention can reduce effectively the number of masks, and thus reducing costs.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
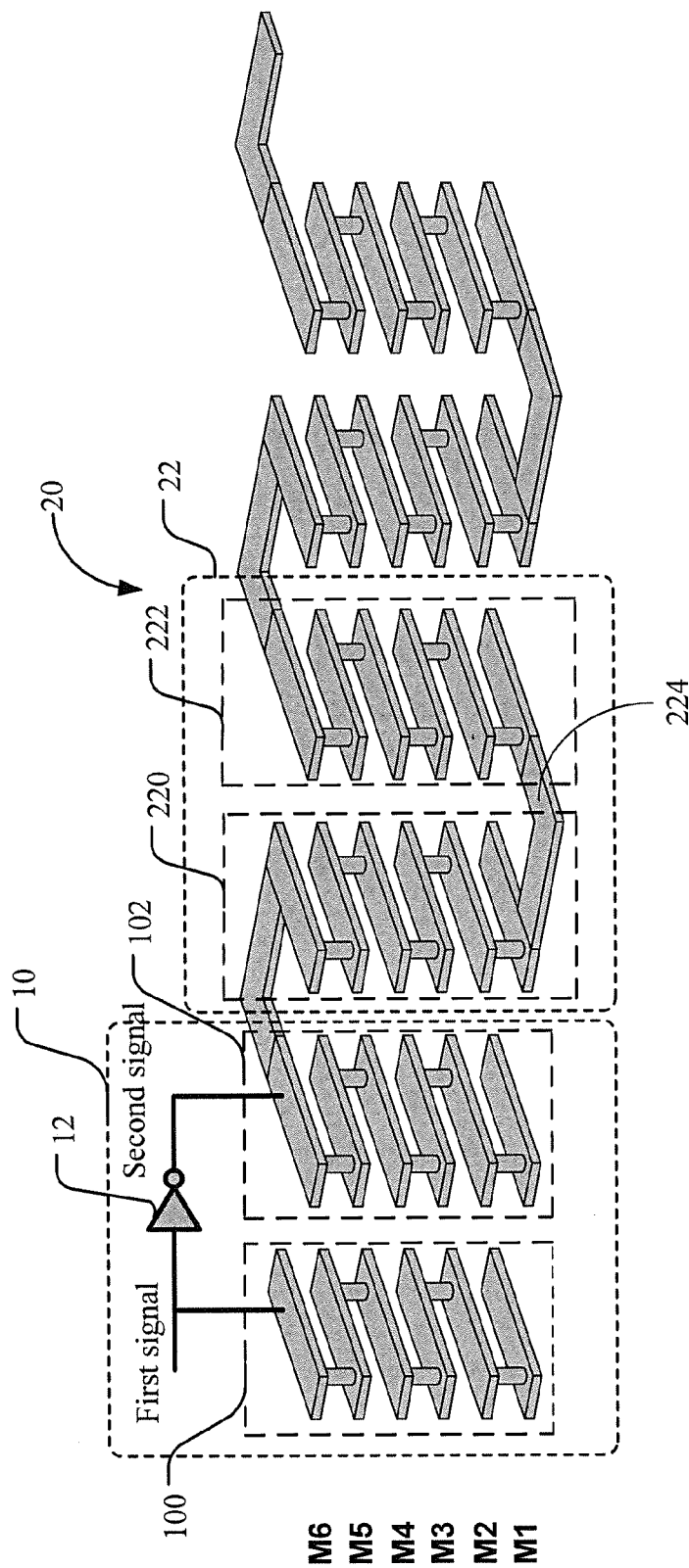
FIG. 1 shows a structural schematic diagram according to a preferred embodiment of the present invention.

FIG. 1 shows a structural schematic diagram according to a preferred embodiment of the present invention. As shown in the figure, the layout structure for integrated circuits according to the present invention comprises a signal-supplying unit 10 and at least a transfer cell 20. The signal-supplying unit 10 is used for providing a first signal or a second signal. Namely, the signal-supplying unit 10 can receive the first signal or the second signal output by an external circuit and thus providing the first or second signal. Alternatively, the signal-supplying unit 10 can itself produce the first signal or the second signal, and thus providing the first or second signal. The levels of the first signal and the second signal are different. For example, if the first signal is a high- (low-) level signal, then the second signal is a low- (high-) level signal. According to the present embodiment, the signal-supplying unit 10 further comprises a conversion unit 12, which receives the first signal, and converts the first signal to the second signal. According to an embodiment, the conversion unit 12 is an inverter. The conversion unit 12 can certainly be composed by other logic elements (AND, OR gates). According to the present invention, the signal-supplying unit 10 is required for providing a high-level signal and a low-level signal. However, in practical applications, every metal layer in integrated circuits includes a power line (VDD) and the ground (GND). Thereby, according to another embodiment, the signal-supplying unit 10 according to the present invention can be composed by the power line (VDD) and the ground (GND).

The transfer cell 20 according to the present invention has three inputs and an output. The three inputs include a high-level input, a front-end signal input, and a low-level input. The output is used for outputting the signals from the high-level, the front-end signal, or the low-level inputs, as the device 20 shown in FIG. 4A or 4B.

The transfer cell 20 has a plurality of metal layers 22 (at least two) interconnected. In general, if the integrated circuit has N metal layers, then the transfer cell 20 also has N metal layers 22. Of course, it is not required that the numbers of metal layer should be the same. For example, a terminal of each of the metal layers 22 is connected electrically to the upper adjacent metal layer, while the other terminal of the metal layer is connected electrically to the lower adjacent metal layer. In so doing, when a metal layer of the plurality of metal layers 22 receives the first signal or the second signal, owing to the interconnection of the plurality of metal layers 22, one metal layer among them can be used for transferring the first signal or the second signal.

If the signal to be transferred by the transfer cell 20 is to be changed, the transfer cell 20 needs to produce "interrupt" and "connect" actions. For example, the metal layers 22 interrupt transferring the first signal, and "connect" for receiving and outputting the second signal. Thereby, the layout structure of the integrated circuit needs to be modified.

The transfer cell 20 of the layout structure according to the present invention comprises a first transfer path 220 and a second transfer path 222. The first transfer path 220 has N metal layer interconnected. Besides, one of the N metal layers, which all can be considered as the input, of the first transfer path 220 is used for receiving the first signal or the second signal. According to the embodiment of FIG. 1, the metal layers of the first transfer path 220 are interconnected. There are many ways of the interconnection. One example is that a terminal of every metal layer of the first transfer path 220 is connected electrically to the upper adjacent metal layer, while the other terminal of the metal layer is connected electrically to the lower adjacent metal layer, as shown in FIG. 1. The upmost metal layer of the first transfer path 220 is connected electrically to the signal-supplying unit 10 for receiving the second signal, namely, the low-level signal.

The metal layers of the second transfer path 222 are interconnected. There are also many ways to do so, such as the interconnection shown in FIG. 1. The second transfer path 222 is coupled to the first transfer path 220 via a connecting wire 224 for transferring the signal from the first transfer path 220.

Figure 2A:
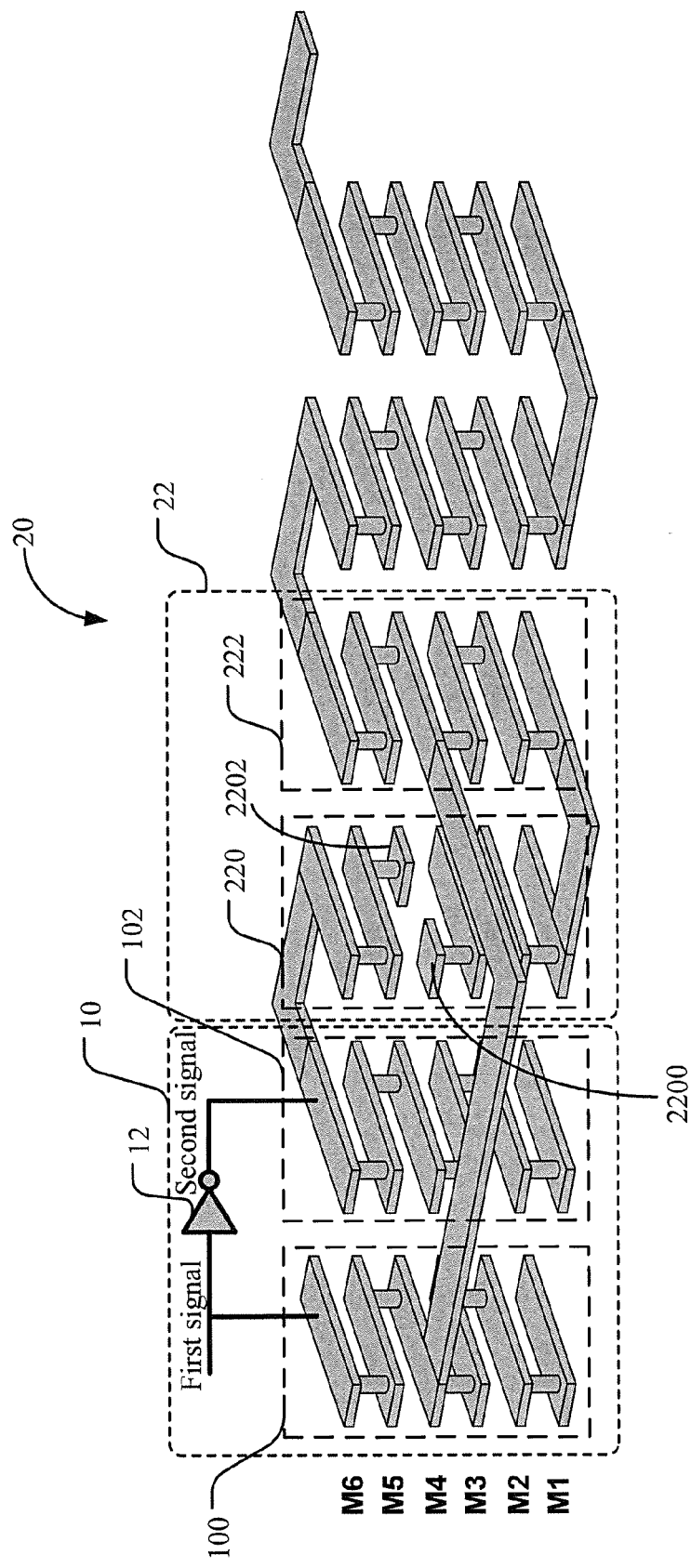
FIG. 2A shows a schematic diagram of actions according to a preferred embodiment of the present invention.

FIG. 2A shows a schematic diagram of actions according to a preferred embodiment of the present invention. According to FIG. 1 and FIG. 2A, it is found that the "interrupt" effect occurs between a first metal block 2200 and a second metal block 2202 on the first transfer path 220 of the transfer cell 20. On the other hand, the second transfer path 222 of the transfer cell 20 connects with the fourth metal layer M4 of the signal-supplying unit 10 and hence producing the "connect" effect.

According to the embodiment of FIG. 2A, if the layout structure of the integrated circuit undergoes the first revision and other modifications on circuit layout uses up to the fourth metal layer M4, because the metal layers of the first transfer path 220 are interconnected, the fourth metal layer M4 of the first transfer path 220 can be interrupted at the middle, namely, the metal wire between the first metal block 2200 and the second metal block 2202 is interrupted, so that transfer of the second signal by the transfer cell 20 is interrupted. Meanwhile, according to the present invention, the fourth metal layer M4 of the second transfer path 22 is connected electrically to the signal-supplying unit 10 for transferring the first signal. Thereby, because the integrated circuit undergoes the first revision and other modifications on circuit layout uses up to the fourth metal layer M4, the transfer cell 200 according to the present invention can be changed directly on the fourth metal layer M4. Accordingly, when the integrated circuit undergoes the first revision, only the fourth metal layer M4 needs to be changed, reducing effectively the number of masks to be changed, and thus reducing costs.

Figure 2B:
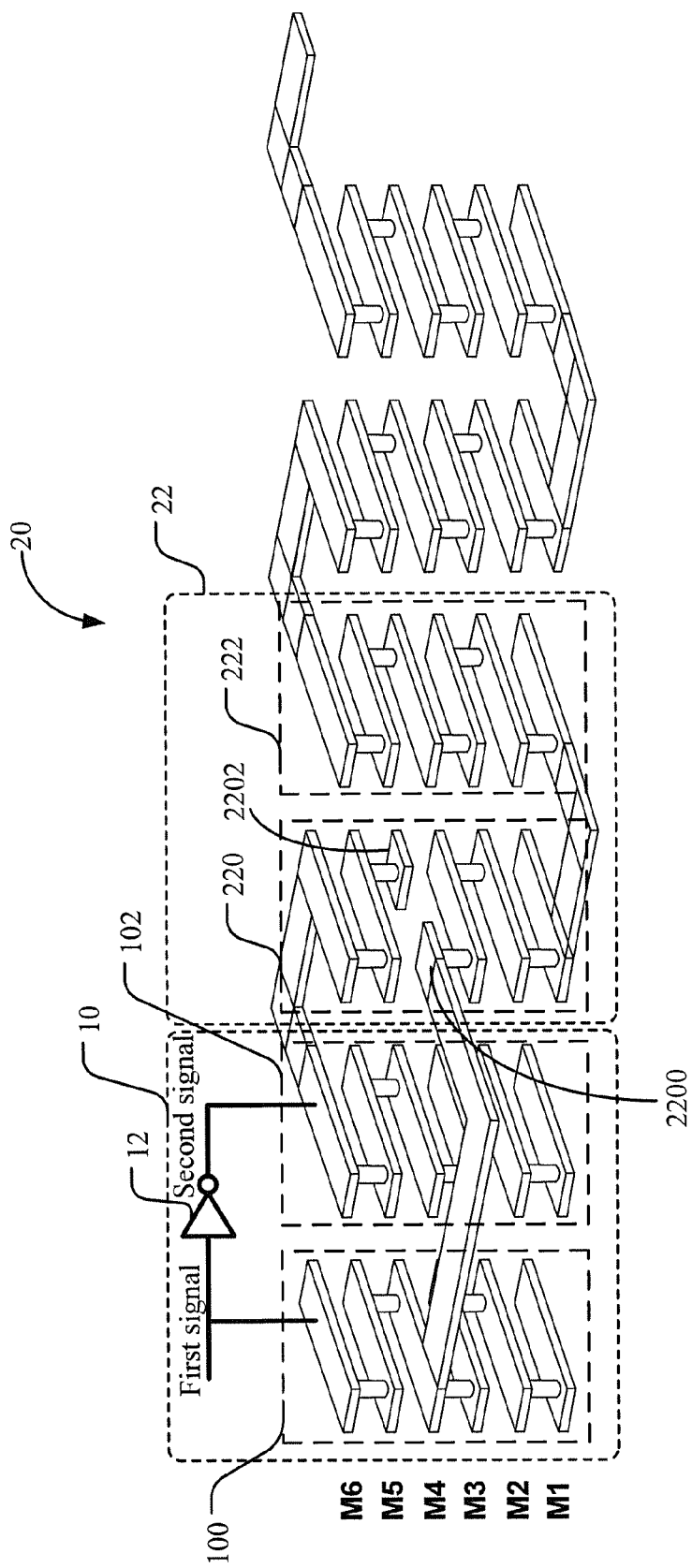
FIG. 2B shows a schematic diagram of actions according to another preferred embodiment of the present invention.
Figure 3:
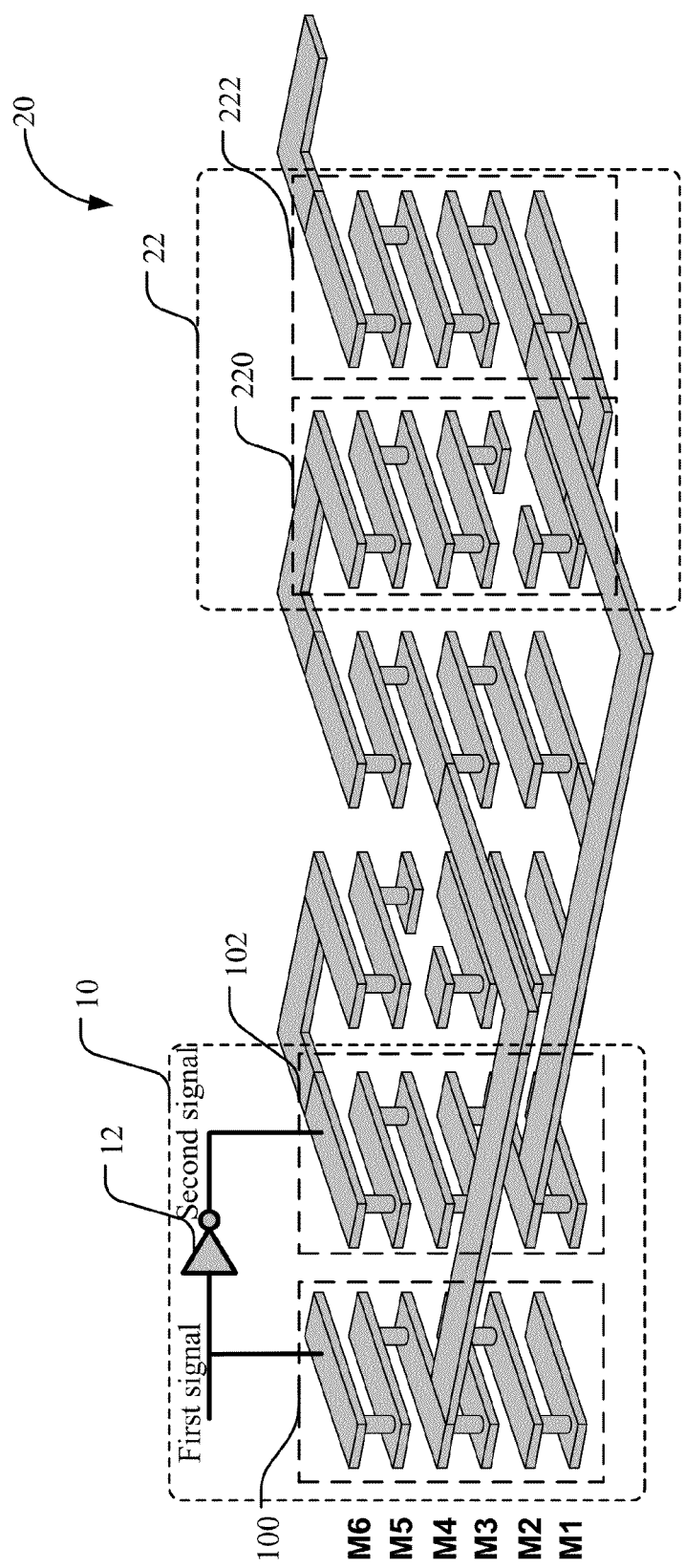
FIG. 3 shows a schematic diagram of actions according to another preferred embodiment of the present invention.

FIG. 2B shows a schematic diagram of actions according to another preferred embodiment of the present invention. As shown in the figure, the difference between the present embodiment and the one in FIG. 2A is that the first metal block 2200 of the fourth metal layer M4 on the first transfer path 220 is connected electrically to the fourth metal layer M4 of the signal-supplying unit 10. Likewise, according to the embodiment of FIG. 3, if the integrated circuit undergoes the second revision, only up to the second metal layer M2 can be used. Besides, when changing the signal transferred by the transfer cell 20 from the first signal to the second signal, the first transfer path 220 interrupts transferring the first signal, and a metal layer on the second transfer path 222 receives and transfers the first signal. According to FIGS. 2A and 3, it is known that when the layout structure of the integrated circuit needs to be revised in a different metal layer, a more transfer cell 20 is needed because only the second metal M2 is modified.

In addition, the signal-supplying unit 10 further comprises a plurality of first supplying layers 100 and a plurality of second supplying layers 102. The first supplying layers 100 are interconnected for receiving and supplying the first signal; the second supplying layers 102 are interconnected for receiving and supplying the second signal. According to FIG. 2A, because the first transfer path 220 is interrupted and the first supplying layer 100 is connected with the second transfer path 222, for FIG. 3, the second transfer path 222 in FIG. 2A can be regarded as a part of the first supplying layer 100, and the connected part between the first transfer path 220 and the second supplying layer 102 in FIG. 2A can be regarded as a part of the second supplying layer 102. In other words, pursuant to the increase of design revisions, the first supplying layer 100 and the second supplying layer 102 can expand naturally. Besides, every metal layer of the first supplying layer 100 and the second supplying layer 102 can be reused. Hence, it is not necessary to worry excessive revisions may result in insufficiency of the first supplying layer 100 and the second supplying layer 102. Of course, the transfer cell 20 can be reused. For example, the third revision uses only the fourth metal layer. Then the transfer cell 20 in FIG. 2A or 2B can b restored to the original structure, and the "interrupt" and the "connect" modifications are performed directly on the fourth metal layer M4 on the second transfer path 22 in FIG. 3.

Furthermore, although the transfer cell 20 in FIGS. 1, 2A, 2B, and 3 is composed by the first transfer path 220 and the second transfer path 222, the present invention is not limited to such a constraint. For example, according to another embodiment, the transfer cell 20 is embodied merely by the first transfer path 220, without the second transfer path 222. In FIG. 2A, the midpoint between the second metal block 2202 and the first metal block 2200 on the first transfer path 220 is interrupted, and the fourth metal layer M4 of the first supplying layer 100 can be connected with the first metal block 2200 for achieving the technical characteristics of the present invention (the figure of connection is identical to the first transfer path 220 in FIG. 2B). Besides, in FIG. 3, the second metal layer M2 of the second supplying layer 102 can be connected with the first transfer path 220. In other words, it is only required that the "interrupt" and the "connect" actions are implemented on the same metal layer.

Figure 4A:
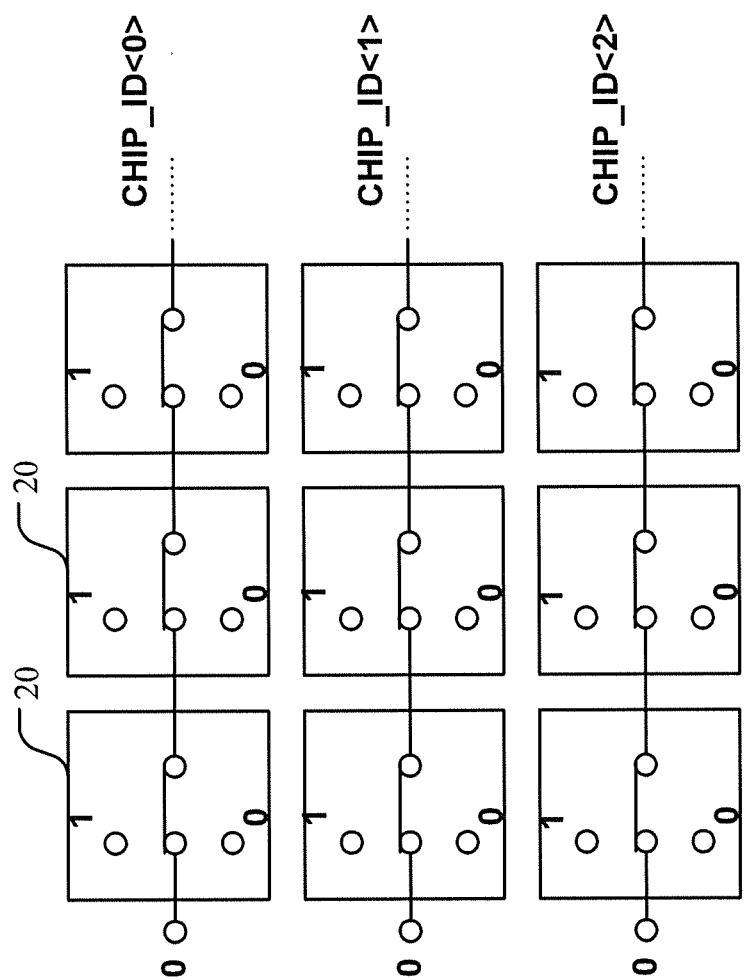
FIG. 4A shows a block diagram according to a preferred embodiment of the present invention.
Figure 4B:
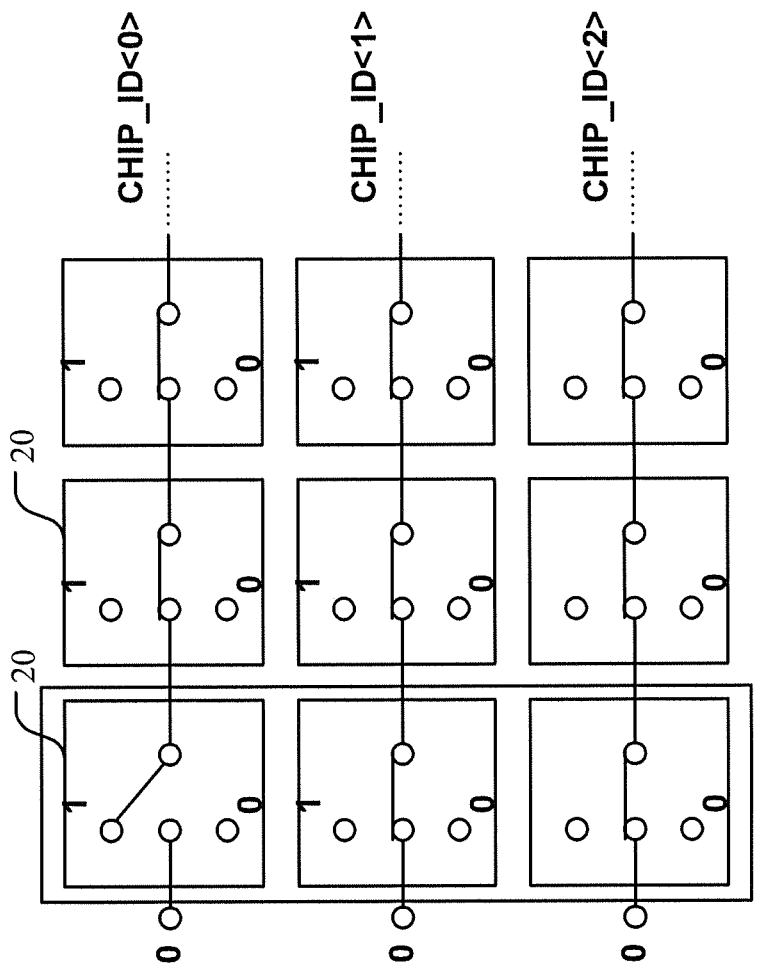
FIG. 4B shows a block diagram according to another preferred embodiment of the present invention.
Figure 4C:
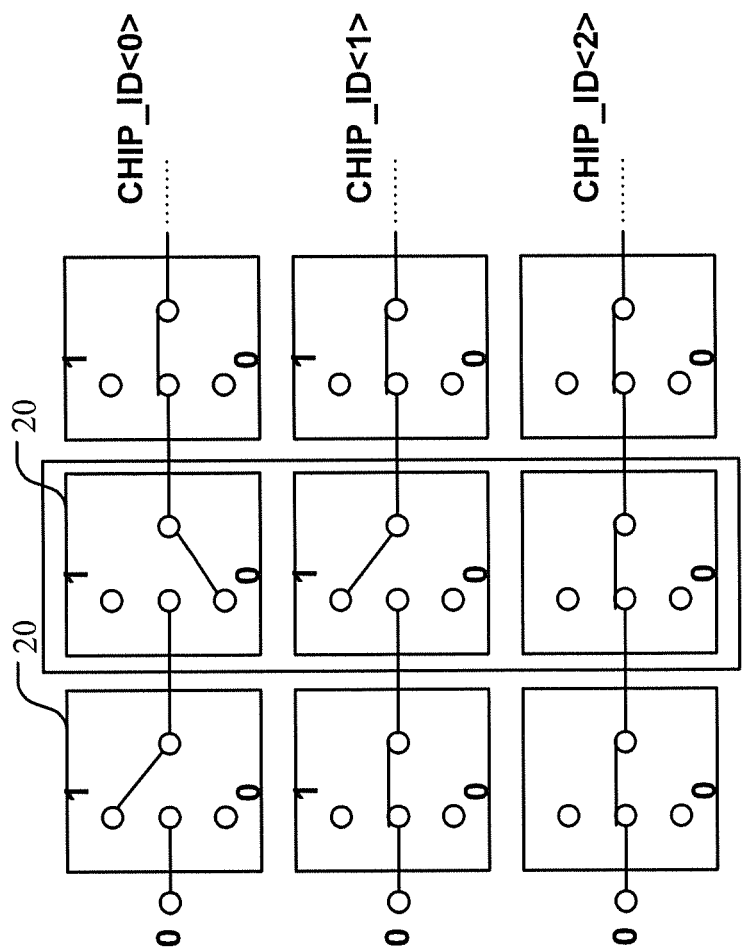
FIG. 4C shows a block diagram according to another preferred embodiment of the present invention.

FIG. 4A and FIG. 4B show block diagrams according to preferred embodiments of the present invention. As shown in the figures, when the layout structure for integrated circuits according to the present invention is applied to revisions of integrated circuits, the transfer cell 20 is equivalent to a switch (multiplexer). According to the present embodiments, three transfer cells 20 are connected in series for forming a transfer routing chain. Three transfer routing chains are used for representing a version number. As shown in FIG. 4A, the layout structure of the integrated circuit is the first version, and its chip ID is 000. Namely, the output signal of the transfer routing chains of the integrated circuit is 000, indicating the version-indicating signal of the integrated circuit. When the layout structure of the integrated circuit is revised for the first time, the layout structure of the integrated circuit needs to be changed to the second version. Then, the transfer cell 20 at the first row and the first column is modified to receive the high-level signal, and hence changing the chip ID of the integrated circuit to be 001, as shown in FIG. 4B. Likewise, when the layout structure of the integrated circuit is revised for the second time, the layout structure of the integrated circuit needs to be changed to the third version. Then, the transfer cell 20 at the first row and the second column as well as the transfer cell 20 at the second row and the second column are modified to receive the low-level signal and the high-level signal, respectively, and hence changing the chip ID of the integrated circuit to be 010, as shown in FIG. 4C.

Moreover, the layout structure for integrated circuits according to the present invention can be applied to debugging the layout structure for integrated circuits. The research and development personnel can modify the metal layer, which is the same metal layer as the debugging location, in accordance with the debugging location. Thereby, substantial modifications, which increase the number of masks, can be avoided, and thus achieving the purpose of reducing costs.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A layout structure for integrated circuits, comprising:
    a signal-supplying unit, receiving a first signal and converting said first signal to a second signal; and
    at least a transfer cell, connected electrically to said signal-supplying unit, said signal-supplying unit supplying said first signal or said second signal to said transfer cell, said transfer cell having a first transfer path and a second transfer path, each of said first transfer path and said second transfer path having a plurality of metal layers interconnected in series, said first transfer path connected electrically to said second transfer path in series;
    wherein when said first signal transferred by said transfer cell is changed to said second signal, one metal layer of said first signal transfer path is interrupted to interrupt transferring of said first signal, and one metal layer of said second signal transfer path receiving and outputting said second signal.

2. The layout structure for integrated circuits of claim 1, and further comprising a connecting layer, connecting in series with said first signal transfer path and said second signal transfer path.

3. The layout structure for integrated circuits of claim 1, wherein said signal-supplying unit comprises a conversion unit, receiving said first signal, and converting said first signal to said second signal.

4. The layout structure for integrated circuits of claim 1, wherein said signal-supplying unit further comprises:
    a plurality of first supplying layers, said first supplying layers being interconnected for receiving and providing said first signal; and
    a plurality of second supplying layers, said second supplying layers being interconnected for receiving and providing said second signal.

5. The layout structure for integrated circuits of claim 4, wherein said first supplying layers are connected in series, and said second supplying layers are connected in series.

6. The layout structure for integrated circuits of claim 1, and applied to revisions for integrated circuits.

7. The layout structure for integrated circuits of claim 1, and applied to debugging the layout structure for integrated circuits.

8. The layout structure for integrated circuits of claim 1, wherein when at least one of said metal layers is interrupted as a first metal block and a second metal block, said first metal block being opposite to one terminal of each adjacent metal layer, said second metal block being opposite to other terminal of each adjacent metal layer, said the signal-supplying unit is connected electrically to said first metal block and said second metal block respectively, for supplying said first signal to said first metal block and supplying said second signal to said second metal block.

* * * * *